United States Patent [19]

Heflinger et al.

[11] Patent Number: 4,893,403
[45] Date of Patent: Jan. 16, 1990

[54] CHIP ALIGNMENT METHOD

[75] Inventors: Bruce Heflinger, Los Altos; Kevin Douglas, San Mateo, both of Calif.

[73] Assignee: Hewlett-Packard Company, Palo Alto, Calif.

[21] Appl. No.: 181,875

[22] Filed: Apr. 15, 1988

[51] Int. Cl.$^4$ ............................................. H05K 3/34
[52] U.S. Cl. .................................. 29/840; 29/744; 361/411
[58] Field of Search ............... 29/739, 740, 741, 743, 29/759, 760, 832, 834, 836, 843, 840, 744; 361/411

[56] References Cited

U.S. PATENT DOCUMENTS

| 3,373,481 | 3/1968 | Lins et al. | 361/411 X |
| 3,486,622 | 12/1969 | Butera | 29/840 |
| 3,657,790 | 4/1972 | Larrison | 29/760 X |
| 3,811,186 | 5/1974 | Larnerd et al. | 29/840 |
| 3,868,764 | 3/1975 | Hartleroad et al. | 29/744 X |
| 3,868,765 | 3/1975 | Hartleroad et al. | 29/744 X |
| 3,887,996 | 6/1975 | Hartleroad et al. | 29/744 X |
| 3,887,997 | 6/1975 | Hartleroad et al. | 29/744 X |
| 3,937,386 | 2/1976 | Hartleroad et al. | 29/760 X |
| 4,097,986 | 7/1978 | Henry et al. | 29/583 |
| 4,345,371 | 8/1982 | Ohsawa et al. | 29/840 X |
| 4,558,812 | 12/1985 | Bailey et al. | 228/180.1 |
| 4,661,192 | 4/1987 | McShane | 29/827 X |
| 4,868,759 | 3/1975 | Hartleroad et al. | 29/744 X |

OTHER PUBLICATIONS

IBM Tech. Discl. Bull., vol. 23, No. 5, Oct. 1980, pp. 2156–2158, by Galloway et al.

Primary Examiner—P. W. Echols
Assistant Examiner—Carl J. Arles

[57] ABSTRACT

A method of aligning integrated circuit chips on a substrate, such as a circuit board, for joinder by means of solder bumps. A stencil mask forms a transfer plate with holes in the same locations as solder bumps on the circuit board. The transfer plate is used to lift integrated circuit chips with metal contact regions loosely seated in holes in another mask, forming a die array plate. Vacuum is applied behind the transfer plate to pick up chips which have been seated on the die array plate. The chips are then moved over the circuit board and deposited onto the solder bumps previously formed and then joined thereto. The transfer plate and the die array plate have hole patterns in the same locations as yet another stencil mask, used for solder deposition in forming the solder bumps.

12 Claims, 3 Drawing Sheets

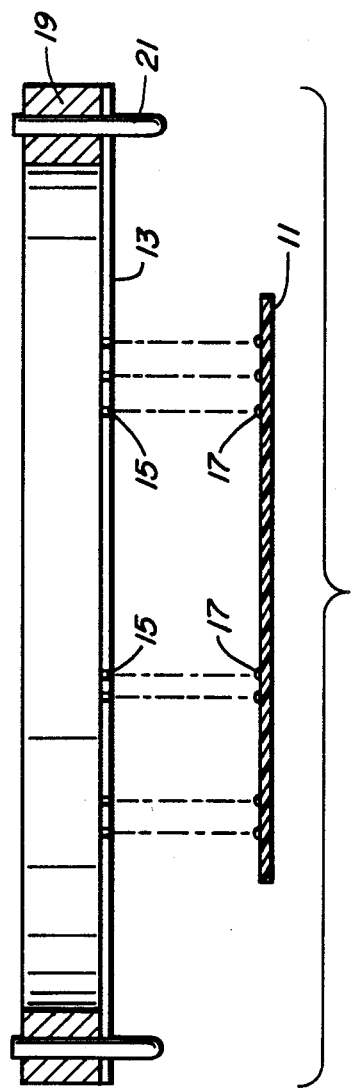
FIG._1.
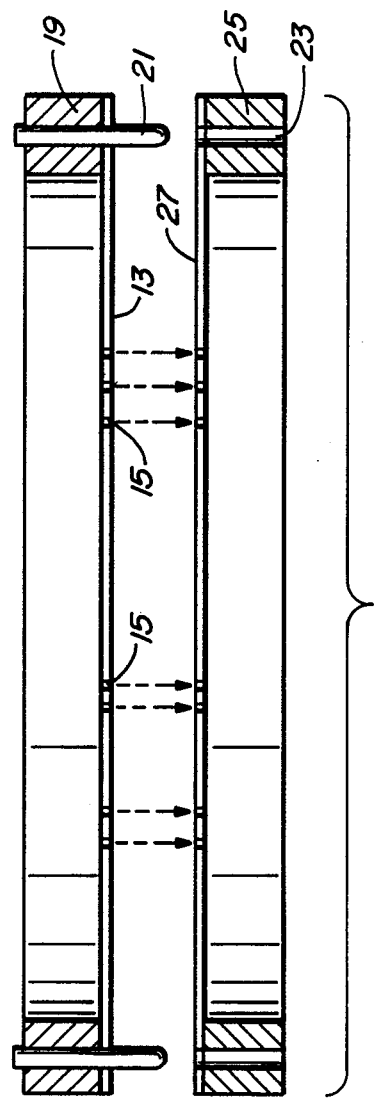
FIG._2.

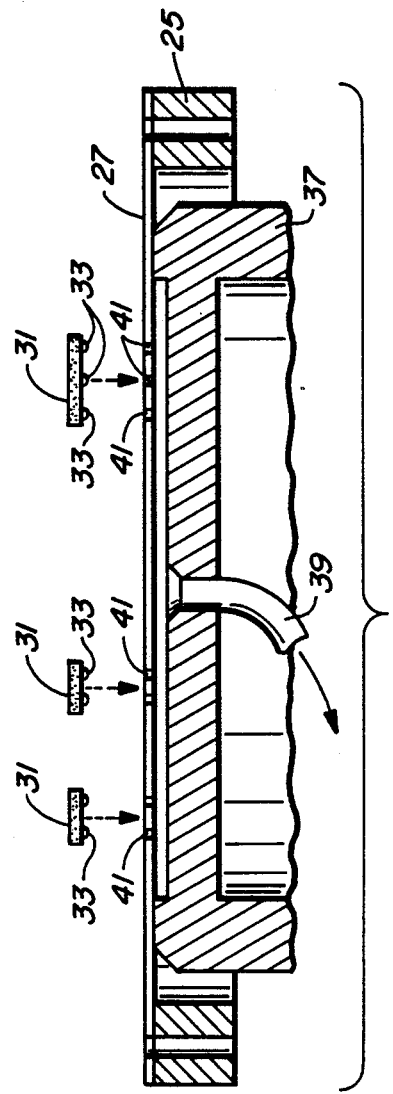
FIG._3.
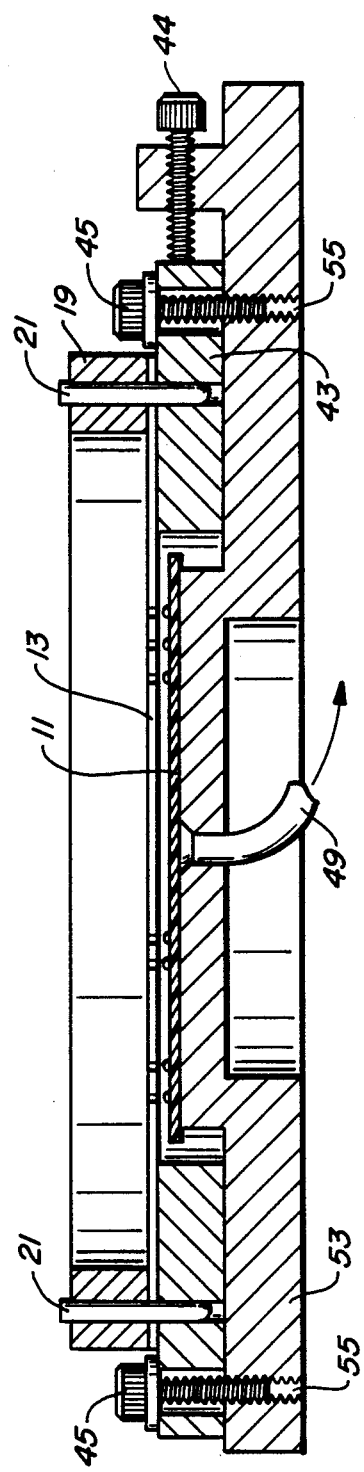
FIG._3A.

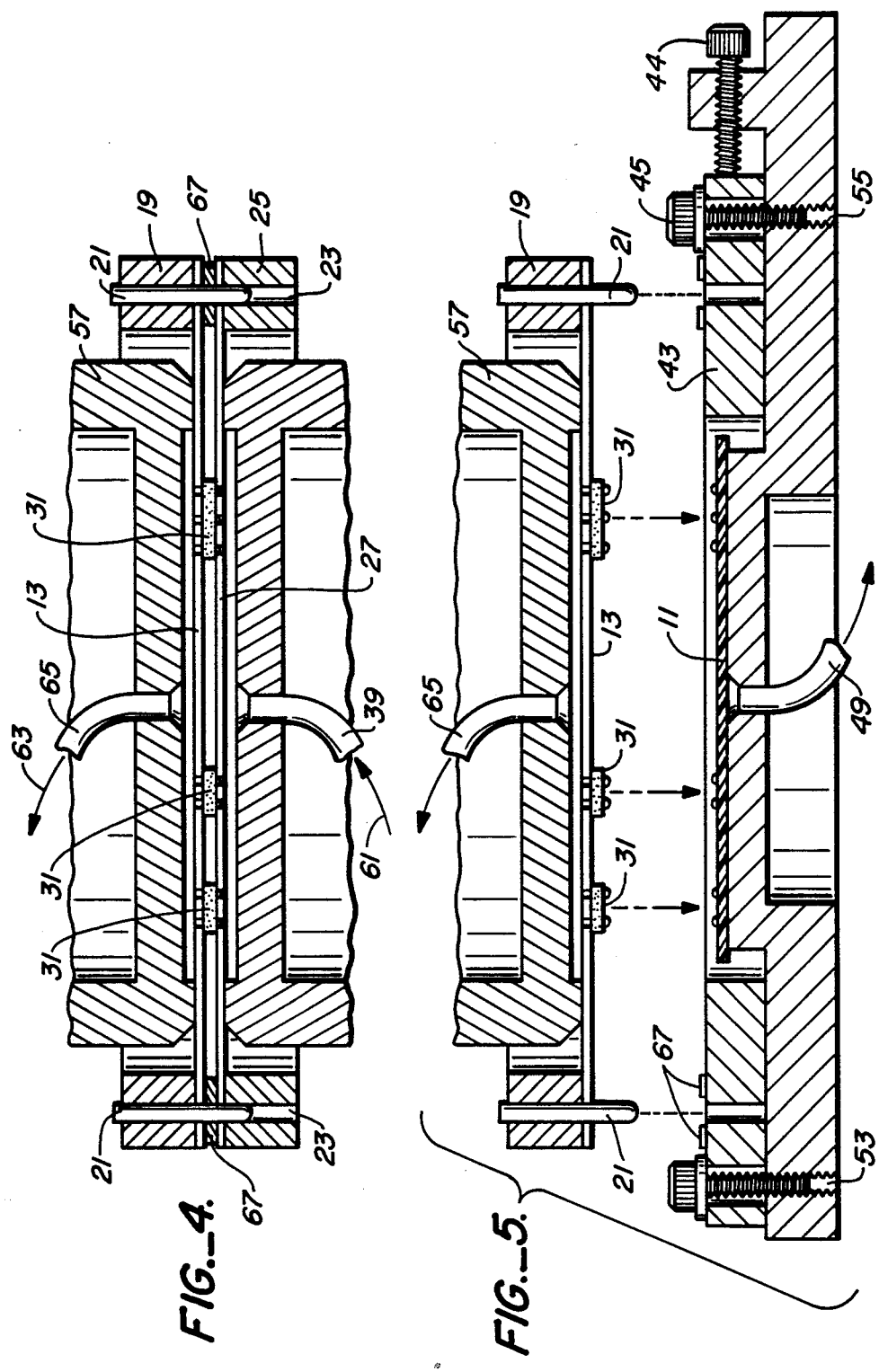

CHIP ALIGNMENT METHOD

TECHNICAL FIELD

The invention relates to a method of simultaneously joining a plurality of integrated circuit chips to a circuit board or other substrate.

BACKGROUND ART

Some integrated circuit chips are fabricated with exposed, small metal contacts or pads on the chips so that the chips may be placed on a substrate, such as a wafer or a circuit board, for direct connection in a joinder process known as "solder bumping". This is in contrast to an older form of chip mounting involving wire leads extending from packaged chips, wherein the leads fit into holes on the board or into sockets mounted on the board.

Solder bump joinder of chips to substrates tends to preserve rising and falling edges of waveforms. This benefit arises because in the transmission of data between chips discontinuities associated with impedance mismatches are minimized. The solder bump technique also allows chips to be directly connected to heat dissipating supports. In U.S. Pat. No. 4,558,812 to A. S. Bailey et al., chip carriers are held in cavities by vacuum. A holder, with the chip carriers held therein is moved over a substrate containing solder preforms and then vacuum is released. The preforms or bumps are then heated to form a solder bump on pads of the chip, allowing it to reflow between the chip and the desired location, where other bumps similarly flow.

In U.S. Pat. No. 4,097,986 to R. Henry et al., there is described a technique of bonding the underside of a diode to a thin substrate, although solder bumps are not used. In this patent, the substrate receiving the chip is specially prepared by patterned etching layers deposited on the substrate and depositing material in the layers to join with the chip.

One prior art approach has been devised in which no special holders nor substrate preparations were required. Each chip was optically aligned with a proper position on a board by means of a beamsplitter cube, inserted between each chip and the circuit board. The board was moved until the images of the chip's solder bump pattern and the circuit board's solder bump pattern coincided. The beamsplitter cube was then swung out of the way, and the chip lowered onto the circuit board. Even when a chip was properly seated in this manner, it was easy to dislodge when seating a neighboring chip. Unusual skill was required to serially place a large array of chips on a board in a short enough time that the solder flux did not dry out before the assembly could be placed in an oven for solder bump reflow to complete the joinder process.

A problem in connection with prior art solder bump methods arises in trying to remove a single chip on a board or substrate for replacement, if defective or in the event of chip failure. It is quite difficult to melt solder bumps under one chip, and to dress the area for its replacement.

An object of the invention is to devise a method for quickly seating integrated circuit chips of the type adapted for direct joinder onto a circuit board or substrate, without modification of the substrate and without special holders for the chips. Another object was to devise a method of replacing defective such chips.

DISCLOSURE OF THE INVENTION

The above objects have been achieved with a method of aligning integrated circuit chips by means of a stencil mask set, with members of the set having holes in identical locations. A first member of the set may be used to deposit solder onto a substrate where the chips are to be mounted, thereby forming solder bumps. A second member of the mask set is used as a positioning member. Chips to be placed on the substrate may be initially positioned on this mask in a manner identical to the desired final position.

A third member of the mask set is used as a transfer plate. Prior to use, the transfer plate is aligned with the substrate. After alignment, the transfer plate is moved over the mask on which the chips have been positioned and the chips are picked up while preserving their alignment. The chips are then placed onto solder bumps on the substrate in the same alignment and heated to complete joinder of the chips to the substrate.

By using a plurality of identical stencil masks, chips intended for solder bump joinder to a substrate may be initially aligned, picked up and joined to the substrate without any special carriers or templates apart from the masks themselves. No modification of the substrate is needed. To replace a bad chip, all chips may be removed, a bad chip replaced in the chip array and then the entire array replaced using the above procedure. By simultaneously seating the entire chip array, solder flux will not have time to dry before it is needed.

BRIEF DESCRIPTION OF THE DRAWINGS

FIG. 1 is a side sectional view of a stencil mask over a substrate for solder deposition.

FIG. 2 is a side sectional view of a stencil mask serving as a transfer plate over a second mask serving as an array plate for mutual alignment of the two needs.

FIG. 3 is a side sectional view of a stencil mask serving as an array plate, with chips being located thereon in an array.

FIG. 3a is a substrate aligned with a stencil mask serving as the transfer plate.

FIG. 4 is a side sectional view of a transfer plate picking up chips from the array plate.

FIG. 5 is a side sectional view of a transfer plate delivering chips to the substrate for joinder thereto.

BEST MODE FOR CARRYING OUT THE INVENTION

With reference to FIG. 1, a substrate 11 is shown where integrated circuit chips are to be mounted. The substrate, which may be a circuit board, is typically made of a dielectric material but has wiring patterns on the upper side including pads or locations where chips are to be mounted. Once such locations are decided upon, coordinates are established for the pads and a master stencil mask 13 is designed with holes 15 at locations corresponding to the pads where chips are to be mounted. Solder is deposited through the holes in the mask onto substrate 11 once the mask 13 and the substrate 11 are brought together. Subsequent alignment with identical masks may be done optically by reflecting light through the holes. Once a mask is used for solder deposition it is no longer used for purposes described below. Rather, the identical masks are used. The deposition of solder leaves small bumps 17 where chips are to be joined. Stencil mask 13 is supported by a circular frame 19 having alignment pins 21 therein.

FIG. 2 shows that alignment pins 21 associated with frame 19 match bores 23 in a frame 25 in a manner such that holes 15 of stencil mask 13 match corresponding holes in another stencil mask, namely array plate 27. To assure that alignment occurs, the holes may be aligned first and then the frames joined to the stencils with pins and holes added later. An alternative procedure is to use upper stencil 13 as a template for drilling holes in the lower stencil mask, thereby forming an array plate.

With reference to FIG. 3, integrated circuit chips 31 have metal contacts or bumps 33 on the under side thereof which correspond to holes 41 in array plate 27. The chips may be located in position by optically placing them over corresponding holes or by the tactile response of the contacts falling into corresponding holes. The chips are preferably already set in place in a desired array from an assembly operation with a vacuum chuck 37 below the array plate 27 having air withdrawn through line 39 so that the chips are held in place on the array plate.

FIG. 3a shows the alignment of the transfer plate formed by stencil mask 13, held by frame 19, with the substrate 11 now shown to be supported on support plate 53. Several adjusting screws 44 are used to move the alignment ring 43, both laterally and rotationally, until the array of solder bumps on circuit board 11 coincides with the array of holes in the stencil mask 13 serving as a transfer plate. Clamping screws 45 then lock the alignment ring in place. Support plate 53 includes bores 55, threaded to receive screws 45, locking alignment ring 43 to the support plate 53. Pins 21 insure that mask 13 will always line up with the solder bumps after the mask is removed and then later brought back.

With reference to FIG. 4, the stencil mask 13 serving as a transfer plate is brought over the die array stencil mask 27 which is serving as an array plate, holding chips 31 in place. An annular shim 67 has been inserted between the two stencils to adjust the stencil-to-stencil gap equal to chip thickness. This could also be accomplished by other methods. The two support rings are aligned by means of pins 21 fitting into bores 23. Because of the alignment previously established between holes in stencil mask 13 and holes in array plate stencil mask 27, the holes of stencil mask 13 will fall on the top side of the chips 31. Thus, a vacuum chuck 57 may be used to lift the chips as vacuum in line 39 is released. Release of vacuum in line 39 is indicated by arrow 61 while the application of vacuum to stencil mask 13 for lifting the chips is indicated by arrow 63. Once the chips are lifted, they are brought over the circuit board or substrate, as indicated in FIG. 5.

With reference to FIG. 5, stencil mask 13 serving as a transfer plate for chips 31 is brought over substrate 11, with vacuum being maintained on the vacuum chuck 57 through line 65. Alignment pins 21 will fit into corresponding bores in the alignment ring 43. An annular shim 67 has been laid over the alignment ring, with the shim thickness chosen to compensate for solder bumps, chip thickness and substrate thickness. Once the alignment pins are seated, solder bumps on the chips 31 will be in contact with the solder bumps on the substrate 11. Prior to bringing the chips into contact, however, flux is applied to exposed solder bumps. This may be done either by spraying flux onto the unmasked substrate 11, by spraying flux through another stencil mask, not shown, which is aligned below the chips 31 or above the substrate 11, by transfer from a flux-coated disc (not shown) onto the solder bumps on substrate 11, or by carefully dipping the solder bumps of the die array in a shallow pool of solder flux. After application of flux, the chips are brought into contact with the solder bumps by lowering the transfer plate. Vacuum is released from the transfer plate, as well as from the substrate; then the substrate is placed in an oven to fuse the chips onto the board.

In repairing a circuit board, all chips may be removed by heating of support plate 53, followed by reversing the motion shown in FIG. 5. Once all chips are removed, they may be tested and any bad chips replaced. Simultaneously, the board may be dressed so that new solder bumps may be established and the process repeated. The die array is placed on the array plate as previously described. The masks, plates and supports are aligned as previously described and the new die array is mounted on the circuit board in the manner described above.

We claim:

1. A method of aligning integrated circuit chips on a substrate comprising,
    making a chip transfer plate from a stencil mask having holes therein in locations matched to solder bumps on a solder bump substrate where integrated circuit chips of the types having contacts for connection to said solder bumps are to be mounted,
    placing said integrated circuit chips in an alignment configuration which is the same as on said solder bump substrate,
    picking up said integrated circuit chips using said transfer plate while preserving chip alignment, and
    placing chip contacts onto solder bumps on the solder bump substrate and joining said contacts to said bumps.

2. The method of claim 1 further defined by using vacuum to pick up said integrated circuit chips.

3. The method of claim 1 further defined by making an array plate from a stencil mask, identical to the chip transfer plate stencil mask, and arranging said chips in said configuration by positioning said chips on holes on the array plate.

4. A method of aligning integrated circuit chips on a substrate comprising,
    making a matched pair of stencil masks, one being a chip array plate and the other being a transfer plate, each mask having holes therein in matched locations where solder bumps are located on a solder bump substrate,
    pre-aligning the transfer plate with said substrate, with holes in the transfer plate matching locations of solder bumps on the substrate,
    removing the transfer plate from said prealigned position,
    placing integrated circuit chips of the type having contacts for connection to said solder bumps onto said array plate with chip contacts disposed on holes of the array plate,
    disposing said transfer plate over the array plate, with holes in the two masks aligned,
    picking up the chips with a tool carrying the transfer plate in a position maintaining alignment with the array plate, and
    placing the chip contacts onto solder bumps on the substrate by bringing the transfer plate into proximity with the substrate in said pre-aligned orientation.

5. The method of claim 4 further defined by supporting the substrate in a fixture having a fixed support for the substrate and a flange movable about the periphery of the substrate and then securing the flange position relative to the substrate on reaching the pre-aligned position.

6. The method of claim 4 further defined by using a vacuum chuck as said tool.

7. The method of claim 5 wherein said pre-alignment of said transfer plate with the substrate is by X, Y and rotational motions of the flange relative to the fixture.

8. The method of claim 5 wherein said securing of the flange position relative to the substrate is by fastening the flange to a member supporting the substrate.

9. The method of claim 4 wherein said chips are picked up at their upper surfaces facing said transfer plate.

10. A method of aligning chips on a substrate comprising, preparing a set of three identical stencil masks, each mask having a hole pattern defined therein in a configuration matching a desired solder bump configuration on a substrate, one mask being a solder deposition template, another mask being a chip array plate, and one mask being a transfer plate, forming solder bumps on said substrate using said solder deposition template, placing contacts of integrated circuit chips of the solder bump type on holes in said chip array plate, corresponding to the desired chip configuration on said substrate, aligning said transfer plate with said substrate wherein solder bumps on the substrate are aligned with corresponding holes in the transfer plate, moving the transfer plate over said integrated circuit chips and applying vacuum to holes in the transfer plate, thereby picking up said chips, and placing said integrated circuit chips over said solder bumps in contact therewith and releasing said vacuum.

11. The method of claim 10 further defined by providing alignment pins in said transfer plate for causing alignment of the transfer plate both with said substrate and said array plate.

12. The method of claim 11 further defined by supporting said transfer plate on a movable alignment ring receiving said alignment pins and clamping said alignment ring to a fixed base supporting said substrate upon alignment of said solder bumps with holes in said transfer plate.

* * * * *